United States Patent [19]

Taki et al.

[11] 4,307,832

[45] Dec. 29, 1981

[54] COMPONENT ENGAGING APPARATUS

[75] Inventors: Yasuo Taki, Hirakata; Mori, Kazuhiro, Katano; Shigeru Araki, Katano, all of Japan

[73] Assignee: Matsushita Electric Industrial Co., Ltd., Kadoma, Japan

[21] Appl. No.: 127,516

[22] Filed: Mar. 5, 1980

[30] Foreign Application Priority Data

Mar. 5, 1979 [JP] Japan .................................. 54/25808

[51] Int. Cl.³ ...................... B23K 31/00; H01L 21/98
[52] U.S. Cl. ..................................... 228/5.1; 228/6 A
[58] Field of Search .......................... 228/4.1, 5.1, 6 A

[56] References Cited

U.S. PATENT DOCUMENTS 3,731,867 5/1973 Frisbie et al. ........................ 228/6 A
3,920,949 11/1975 Clawson et al. ................. 228/4.1 X
3,964,664 6/1976 Butler et al. ......................... 228/6 A
4,166,562 9/1979 Keizer et al. .................... 228/6 A X Primary Examiner—Robert D. Baldwin
Attorney, Agent, or Firm—Wenderoth, Lind & Ponack

[57] ABSTRACT

An improved component engaging apparatus for mounting electrical and electronic components or the like onto a circuit board or substrate which includes a bonding agent applying unit for applying the bonding agent onto the substrate, a chip component mounting section for mounting electronic parts onto the bonding agent on the substrate, a chip component feeding section for sequentially feeding the chip components, a driving section for the chip component feeding section, and a substrate support section which is arranged to alter its position with respect to the chip component mounting section and bonding agent applying section.

4 Claims, 29 Drawing Figures

COMPONENT ENGAGING APPARATUS

The present invention generally relates to a mounting apparatus of electronic parts and components, and more particularly, to an apparatus for engaging microelectronic components or the like with electronic circuit boards, etc.

Conventionally, there have been employed two methods for engaging, with a circuit board or substrate B (hereinafter referred to as substrate), microelectronic components P (hereinafter referred to as chip components) of a leadless type such as chip type resistors, chip type ceramic capacitors or the like as shown in FIG. 1. One of the methods is such that, bonding agent or solder Sc in a creamy state is applied onto the substrate B, as shown in FIG. 2, by a screen printing method, a dispenser method or the like and thereafter, the chip components are temporarily fixed in several locations on the substrate to solder the electrodes of the chip components on the predetermined circuit locations of the substrate. The other method thereof is such that, solder layers S are formed in advance in the engaging locations of the chip components in the substrate circuit as shown in FIG. 3. Adhesive flux F is applied onto the substrate circuit face from above. Then, the chip components P are temporarily fixed, by the adhesive force of the flux, to the given locations of the substrate B. The solder layers on the substrate B are heated to solder the electrodes of the chip components on the predetermined circuit locations of the substrate. However, according to the former method, the bonding material and the creamy solder are required to be applied in advance onto the predetermined locations and a coating apparatus such as a screen printing press or the like is required in an independent process of the chip component engagement. Moreover, since a process for applying adhesive material such as bonding material, creamy solder or the like is separated from the engaging process for the chip components, there are many problems involved, for example, requirements of extra care in the handing of the adhesive substrate between these processes. Meanwhile, in the latter method, although a simple apparatus will meet the purpose to apply the flux on the substrate circuit face, there are still such disadvantages that another apparatus is required, and that particular care has to be directed to the handling of the substrate when the flux has been applied over the entire face of the substrate circuit face, since the substrate is adhesive, while, when the solder layers have been heated after the engagement of the chip components, for soldering the flux is evaporated, thus generating smoke and unpleasant smell, or the chip components temporarily fixed in the predetermined locations of the substrate are positionally deviated.

Accordingly, an essential object of the present invention is to provide a reasonable engaging apparatus for electronic components, which is free from the conventional disadvantages as described hereinabove, with particular features as follows.

(1) A special apparatus such as screen printing press or the like is not required for a process prior to the engaging operation.

(2) The substrate can be easily prepared, since the substrate coated with a bonding material is handled only within the engaging apparatus.

(3) The bonding material coating and the electronic component engagement can be performed within the same apparatus.

(4) For supplying the components, a simple tape having the same chip components arranged thereon may be employed. By merely preparing such tapes for the kinds required for the mounting onto the substrates, it is possible to mount necessary kinds of chip components at required positions on one substrate. When it is required to change the chip component engaging positions on the substrate, such alterations may be readily effected.

Another important object of the present invention is to provide an engaging apparatus of the above described type which is accurate in functioning and simple in construction, and can be readily introduced into manufacturing processes of electrical and electronic equipment at low cost.

In accomplishing these and other objects according to one preferred embodiment of the present invention, there is provided a component engaging apparatus for mounting electronic components and the like onto a substrate which includes: a bonding agent applying unit for supplying bonding agent to clip component mounting positions on a substrate; a chip component mounting section disposed at a predetermined interval from the bonding agent applying unit for placing electronic parts on the bonding agent applied on the substrate; a chip component feeding section provided with a plurality of rows of component feeding devices for sequentially feeding in a line, the chip components to be mounted at the chip component mounting section; a driving section for driving the chip component feeding section which causes the plurality of the component feeding devices to relatively move with respect to the chip component mounting section for bringing the chip component feeding section into component withdrawal position of the chip component mounting section in a predetermined order; and a substrate support section, which supports the substrate at the same interval as the predetermined interval between the bonding agent applying unit and the chip component mounting section. The substrate support section is further provided with means for altering the relative position thereof with respect to the chip component mounting section and bonding agent applying unit.

By the arrangement according to the present invention as described above, an improved electronic component engaging apparatus which is highly efficient in operation has been advantageously presented through simple construction and at low cost, with substantial elimination of disadvantages inherent in the conventional arrangement of this kind.

These and other objects and features of the present invention will become apparent from the following description of the preferred embodiments thereof with reference being made to the accompanying drawings, in which.

Figure 1:
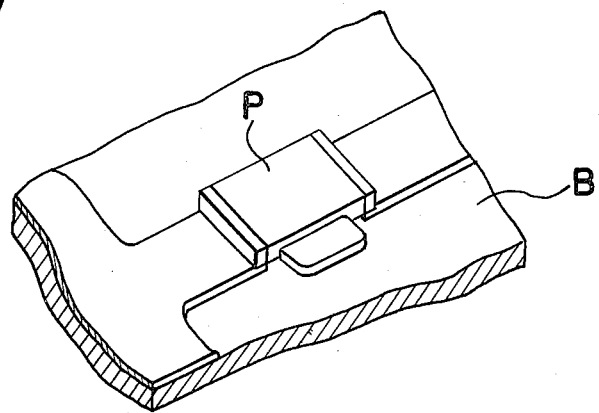
FIG. 1 is fragmentary perspective view of a substrate with a chip component temporarily fixed therein (already referred to)
Figure 2:
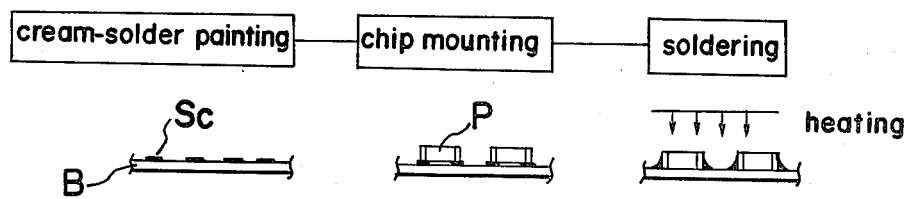
FIGS. 2 and 3 are diagrams each explanatory of the conventional mounting method of chip components onto a substrate (already referred to)
Figure 3:
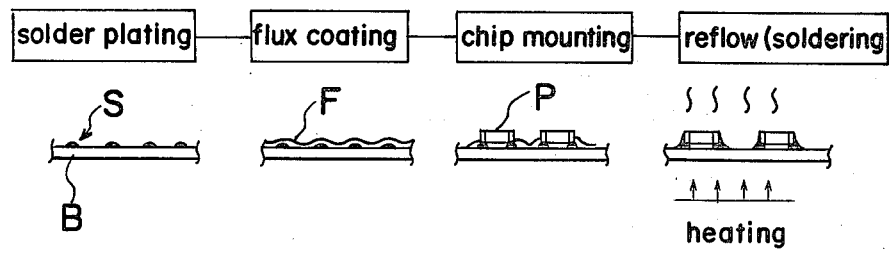
Figure 4:
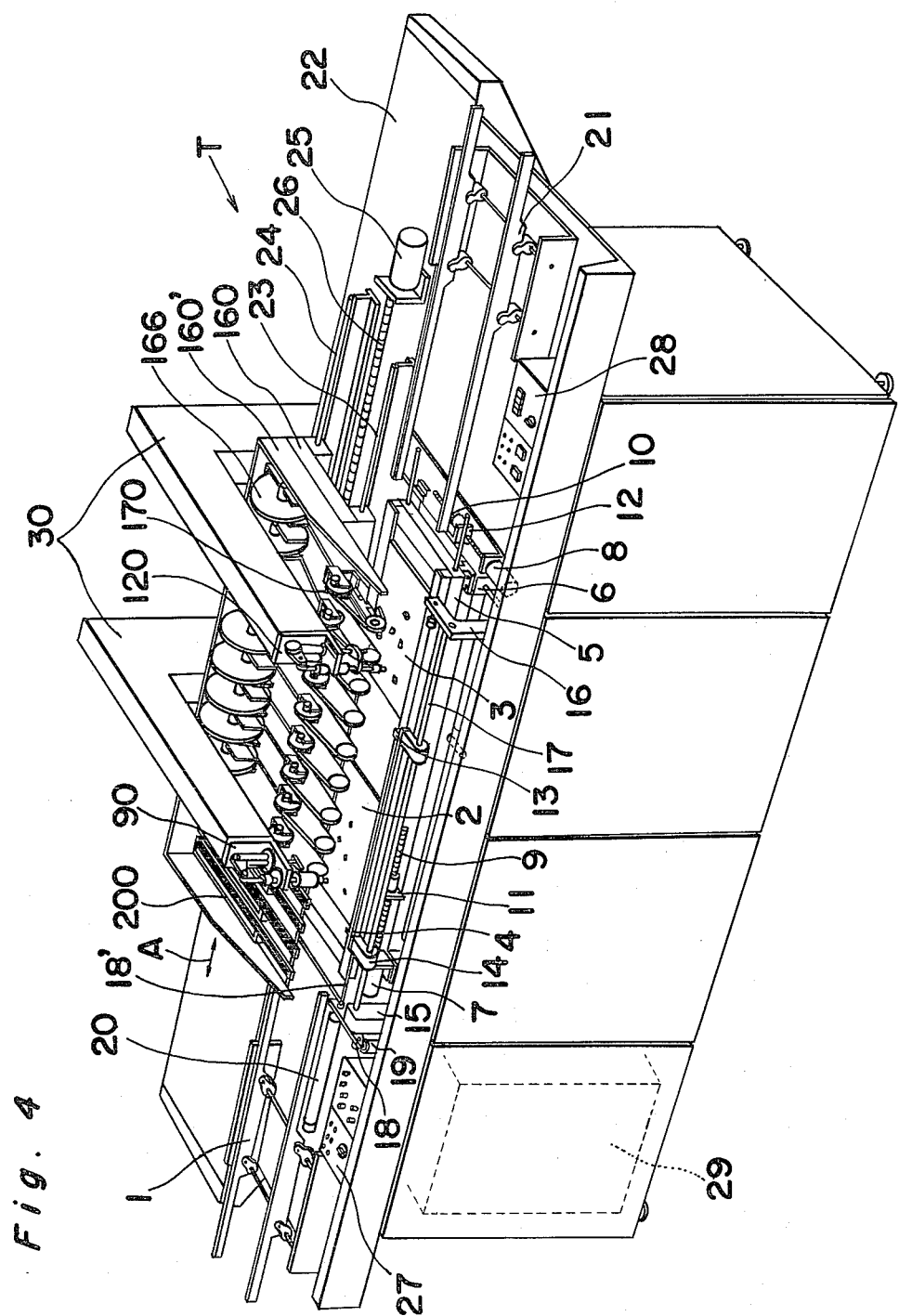
FIG. 4 is a perspective view of an electronic component engaging apparatus according to one preferred embodiment of the present invention.
Figure 12:
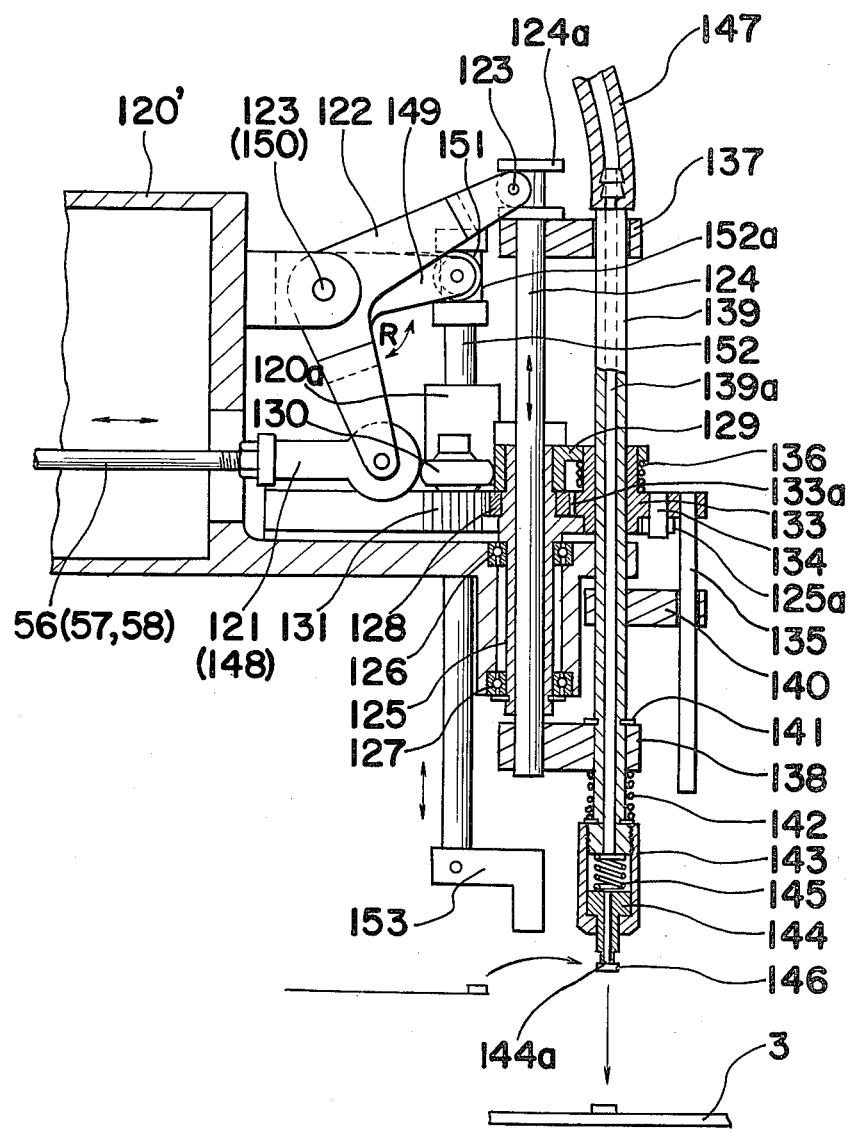
FIG. 12 is a fragmentary side sectional view of a chip component engaging unit employed in the arrangement of FIG. 4.
Figure 15:
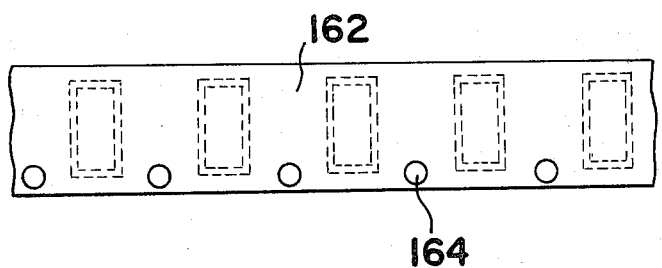
Figure 16:
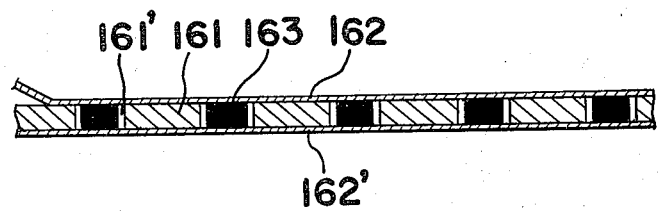
Figure 17:
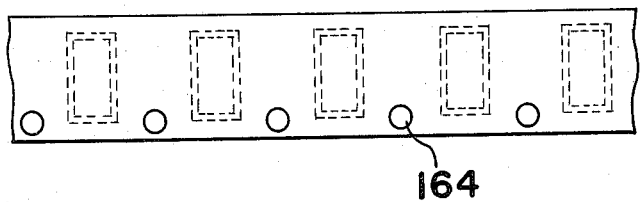
Figure 18:
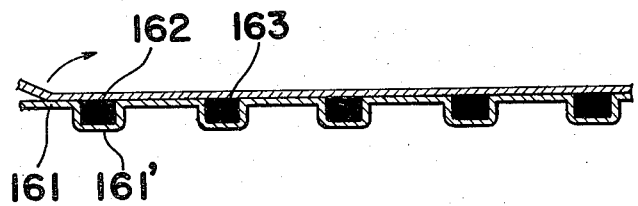
Figure 19:
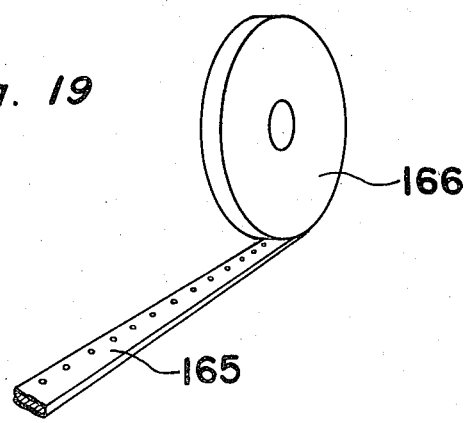
Figure 20:
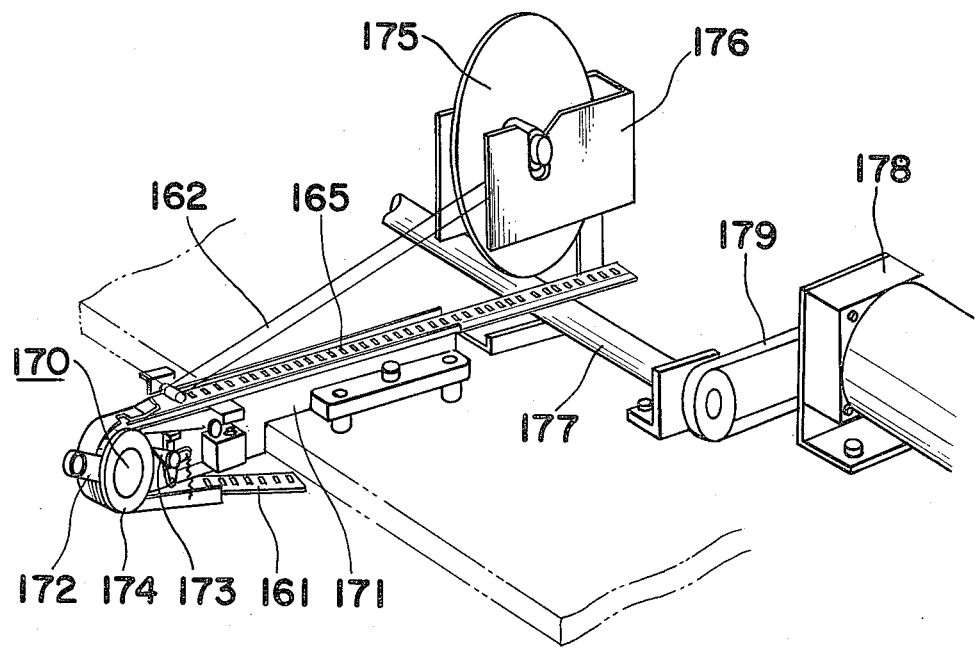
Figure 21:
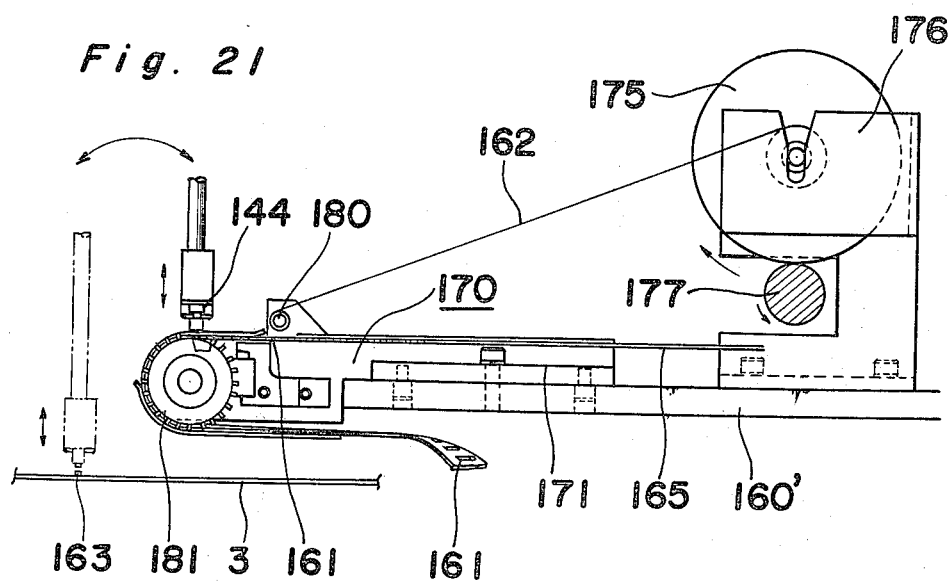
Figure 22:
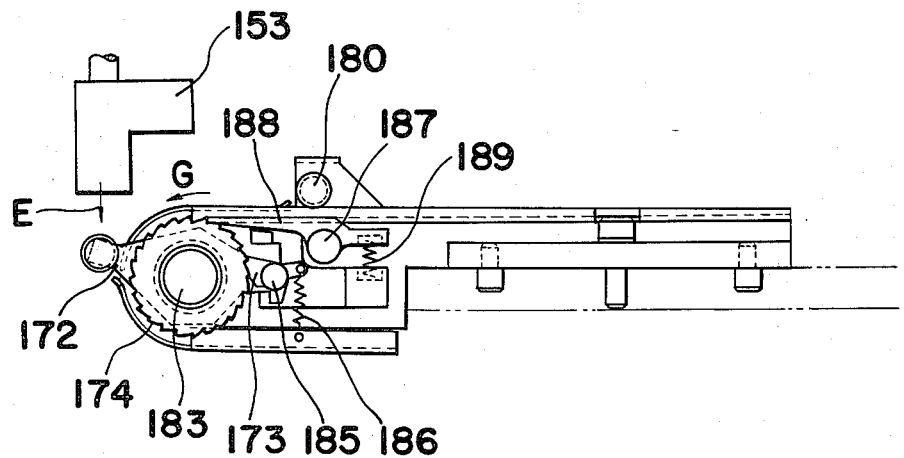
Figure 23:
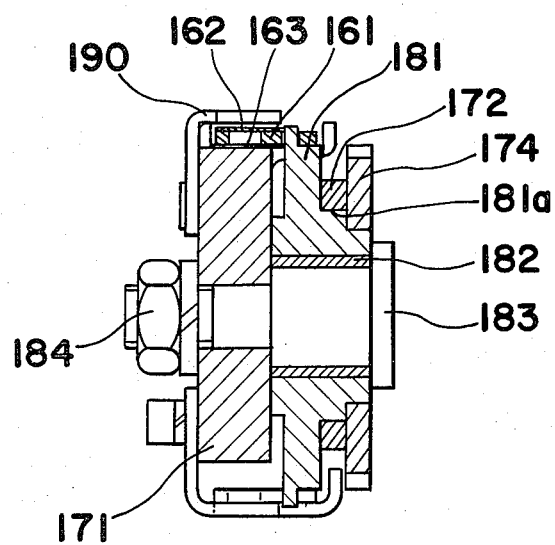
Figure 24:
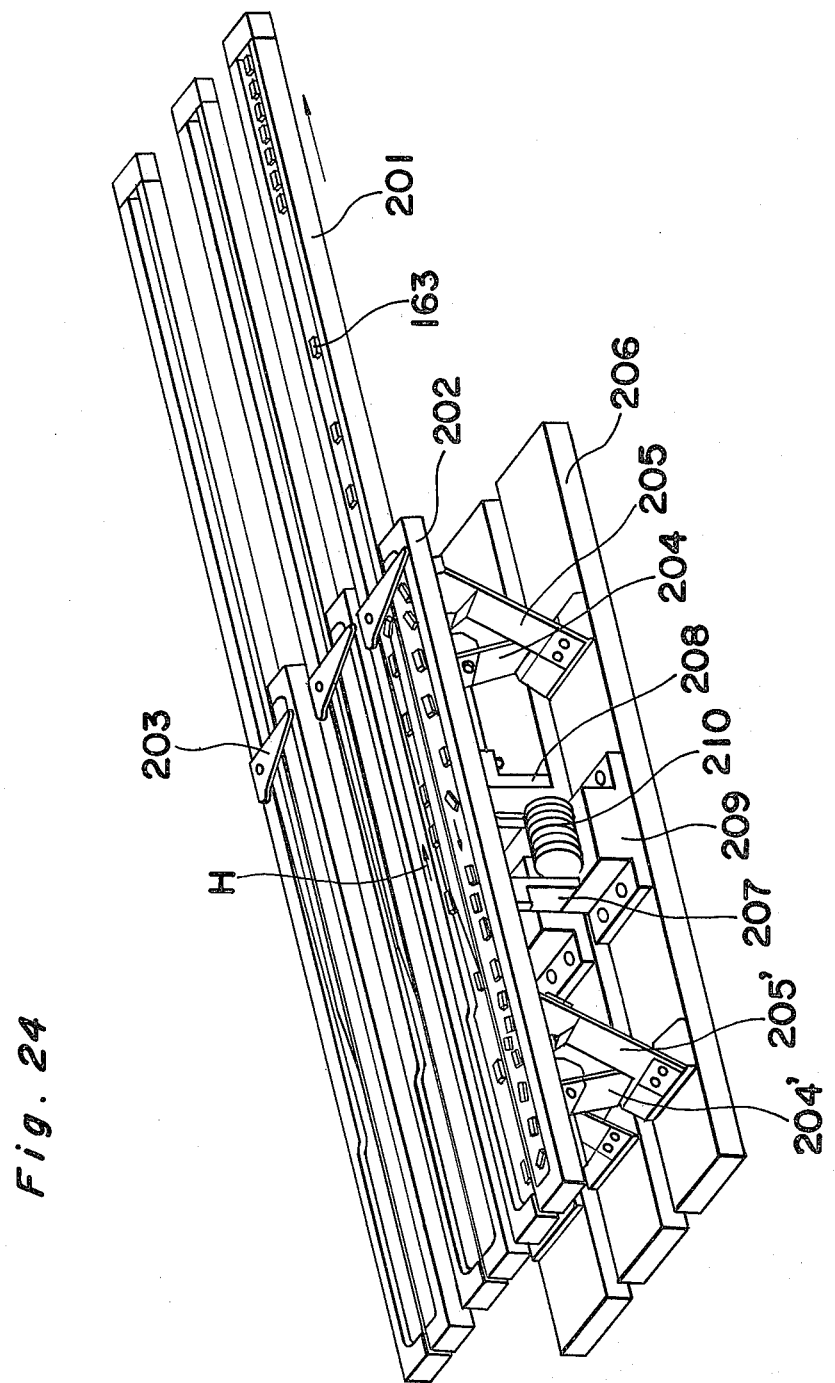
Figure 25:
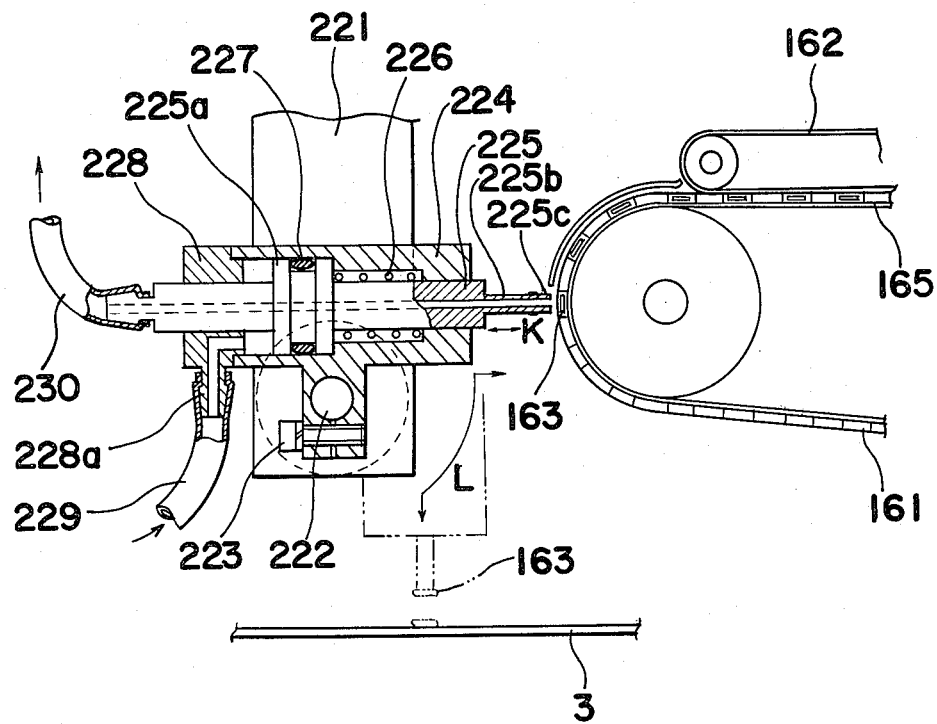

FIGS. 14(a), 14(b), 14(c) are fragmentary diagrams each explanatory of the main portion of the unit of FIG. 12;

FIG. 15 is a top plan view showing one example of taped chip components;

FIG. 16 is a side sectional view of the taped chip components of FIG. 15;

FIG. 17 is a view similar to FIG. 15, but shows another example of the taped chip components;

FIG. 18 is a side sectional view of the taped chip components of FIG. 17;

FIG. 19 is a perspective view showing the appearance of the taped chip components;

FIG. 20 is a fragmentary perspective view of a taping cassette;

FIG. 21 is a side sectional view of the taping cassette of FIG. 20;

FIG. 22 is a side elevational view of the taping cassette of FIG. 20;

FIG. 23 is a partial cross-sectional view of the taping cassette of FIG. 20;

FIG. 24 is a perspective view of a straight advance feeder of a vibrating type; and FIG. 25 is a fragmentary side sectional view, showing a modification of the electronic component engaging apparatus of FIG. 4.

Before the description of the present invention proceeds, it is to be noted that like parts are designated by like reference numerals throughout several views of the accompanying drawings.

Figure 5:
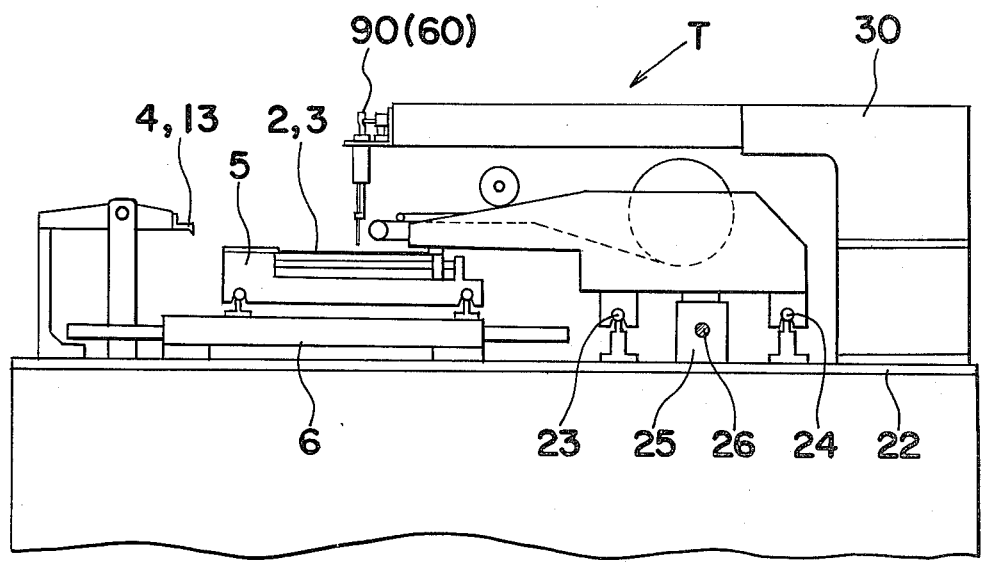
FIG. 5 is a schematic side elevational view of the apparatus of FIG. 4.

Referring now to the drawings, there is shown in FIGS. 4 and 5, an electronic component engaging apparatus T according to one preferred embodiment of the present invention.

The apparatus T generally includes a bonding agent coating apparatus 90 for feeding bonding agent to chip component engaging positions on a substrate, a chip component engaging unit 120 disposed at a given interval from the bonding agent coating apparatus thereby placing electronic components on the bonding agent of the substrate, a chip component feed unit 160 provided with plural rows of component feed apparatuses each being adapted to sequentially feed, in one line, the chip components to be engaged on the chip component engaging unit, a chip component feed unit driving unit 30 for moving the plural component feed units to the chip component engaging unit to bring the chip component feed units, in a given order, to the component taking-out positions of the chip component engaging unit 120, and a substrate support unit 5 for supporting the substrate at the same intervals as the given intervals between the bonding agent coating apparatus and the chip component engaging unit and having a means for varying the relative position with respect to the chip component engaging unit and the bonding agent coating apparatus, wherein the bonding agent coating for temporarily securing the chip components to the substrate and the engagement of the chip components with the bonding agent on said substrate are performed within the same apparatus, each of which apparatuses and units is described in detail hereinbelow with reference to the drawings.

In FIGS. 4 and 5, a loader apparatus 1 is adapted to automatically feed circuit substrates into the central portion of an electronic component engaging apparatus as shown with substrates 2 and 3 in a known manner. The substrates provided by the loader apparatus 1 are fed, onto the upper table 5 of an XY stand disposed at the apparatus central portion, by substrate carrying pawls 4 and are disposed in the condition of the substrates 2 and 3. The upper table 5 and the lower table 6 of the XY stand are driven, respectively, by pulse motors 7 and 8 which rotates ball screws 9 and 10 engaging with nuts 11 and 12, respectively, so that the tables may be horizontally moved in the directions of X and Y through the nut 11 secured to the upper table 5 and the nut 12 secured to the lower table 6. On the upper table 5, the substrates 2 and 3 are adapted to be secured at a given interval, which is equal to the interval between a bonding agent applying apparatus 90 and a chip component engaging apparatus 120. The moving mechanism for the substrates 2 and 3 will be described hereinafter. A bracket 14 with a carrying pawl 4 for retaining the given location of the substrate 2 and a carrying pawl 13 for retaining the given location of the substrate 3 being secured thereon is slidably engaged with a spline shaft 17 whose ends are supported by bearings 15 and 16 to arms provided on a base body 22 of the electronic component engaging apparatus. One end of the spline shaft 17 is secured to the intermediate portion of a rotary lever 18. A cylinder 19 is mounted at one end of the rotary lever 18 to rotate the rotary lever 18 together with the spline shaft 17. Another cylinder 20 for shifting the bracket 14 is secured to the other end of the rotary lever 18. The distal end of the cylinder rod 18' of the cylinder 20 is coupled to the bracket 14 with the carrying pawls 4 and 13 which can carry the substrates 2 and 3 by a given pitch through the thrust of the cylinder 20. When the carrying operation of the cylinder 20 is over, the operation of the cylinder 18 rotates the spline shaft 17 to separate the carrying pawls 4 and 13 from the substrates 2 and 3. An unloader unit 21 takes the delivered substrate 3 out of the central portion of apparatus in a known manner.

The bonding material applying apparatus 90 and the chip component engaging apparatus 120 to be operated by a driving unit 30 of the same system are disposed at an interval equal to the interval at which the substrates 2 and 3 are supported on the upper table 5. The applying apparatus 90 and the engaging apparatus 120 are secured on the body base 22 so that the apparatuses 90 and 120 can simultaneously operate with respect to the substrates through the simultaneous movement of the substrates 2 and 3. A chip component feed unit 160, independent of the upper and lower tables 5, 6, the bonding material apparatus 90 and the engaging apparatus 120, is provided slidably guided by guide shafts 23 and 24 of the body base 22 along which the chip component feed unit 160 is movable in the direction in an arrow A of FIG. 4 through the rotation of a ball screw 26, which is secured to the chip component feed unit 160 and is driven by a pulse motor 25 secured to the body base 22.

A plurality of taping cassettes 170 and straight advance feeder 200 of a vibration type for the chip components are disposed on the chip component feed unit 160 to ensure the stable feed of the various types of chip components to the substrates. In addition, controlling operation boxes 27 and 28 for the apparatus are mounted on the front portion of the body base 22 and the control unit 29 thereof is incorporated inside the apparatus.

Figure 6:
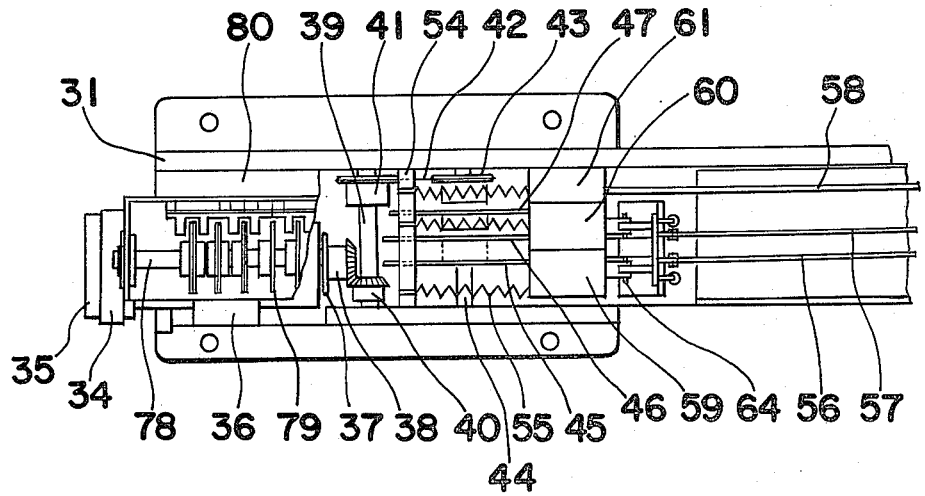
FIG. 6 is a fragmentary top plan view of a driving unit employed in the arrangement of FIG. 4.
Figure 7:
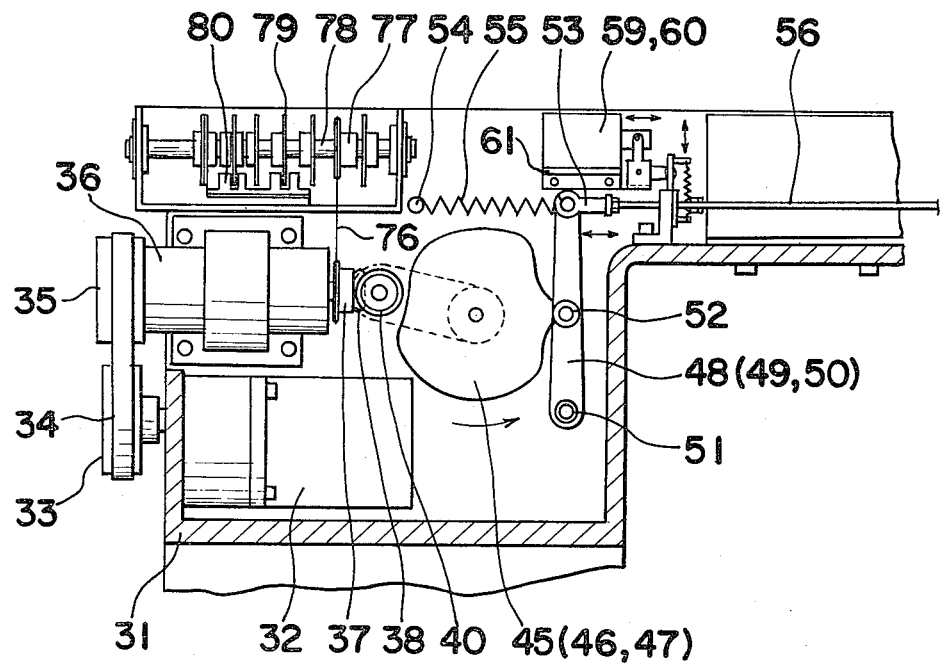
FIG. 7 is a side sectional view of the driving unit of FIG. 6.
Figure 8:
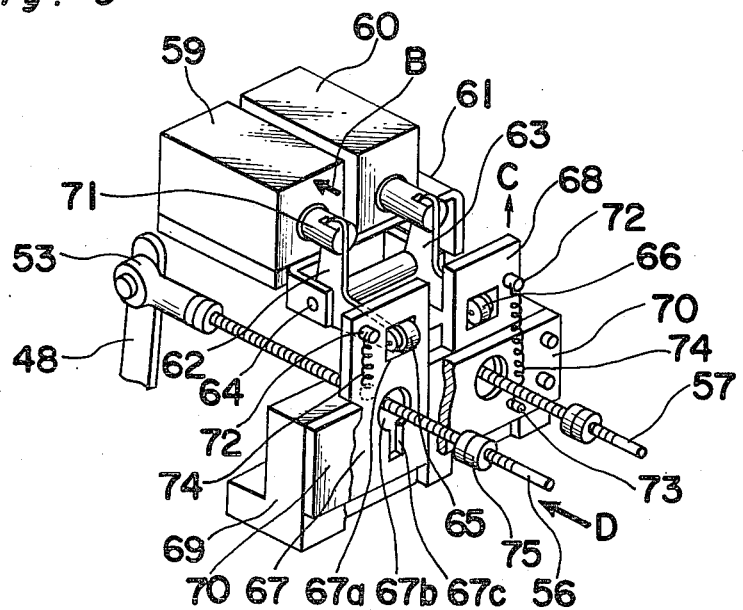
FIG. 8 is a fragmentary perspective view of a shutter unit employed in the arrangement of FIG. 4.

The driving unit 30 will be described hereinafter in detail with reference to FIG. 6 and FIG. 7. Referring to the drawings, a turning effort is transmitted to a pulley 35 provided on the drive side of a clutch lever 36 through a V-pulley 33 and a V-belt 34, by a driving motor 32 secured to a frame 31 of the driving unit 30. The turning effort of the pulley 35 on the drive side is transmitted to the output side during the clutching operation of the clutch brake 36 to rotate a chain sprocket 37 and a bevel gear 38, the bevel gear 38 engaging a bevel gear 40 secured to an intermediate shaft 39 to rotate the intermediate shaft 39 to which a chain sprocket 41 is secured. The rotation of the chain sprocket 41 is transmitted to the cam shaft 44 by a chain sprocket 43, which is secured to the cam shaft 44 and is connected with the chain sprocket 41 by a chain 42. The plate cams 45, 46 and 47 are secured to the cam shaft 44 to oscillate the corresponding oscillating levers 48, 49 and 50 which are engaged with to plate cams 45, 46 and 47 by a follower roller 52 provided at the middle portion of the levers 48, 49 and 50, and are rotatably mounted on the frame 31 by a support point shaft 51 at one end of the levers. Also, couplings 53 are mounted, respectively, on the other ends of the oscillating levers 48, 49 and 50. A tension spring 55 is urged between the couplings 53 and a spring engaging pin 54 provided on the frame 31. Tie rods 56, 57 and 58 are secured to the couplings 53 so as to transmit the driving force to the bonding material applying apparatus 90 or the chip component engaging apparatus 120 (see FIG. 4) disposed on the distal end of the driving unit 30. Also, a shutter mechanism is provided on the intermediate portions of the tie rods 56 and 57 and comprises solenoids 59, 60, a bracket 61 for mounting the solenoids 59, 60 on the frame 31, oscillating levers 62, 63 operated by solenoids, a support point shaft 64 for levers, rollers 65, 66 of levers, shutters 67, 68 engaging with rollers, a shutter holder 69 and a cover 70 for shutters. The function of the shutter mechanism will be described in detail with reference to FIG. 8. Referring to FIG. 8, both of the shutters 67 and 68 are operated by the same operation mechanism together with each other. The solenoid 59 is secured by the mounting bracket 61 and rotates the oscillating lever 62 around the support point 64 provided at the intermediate portion of the lever 62 through a pin 74 provided between the solenoid 59 and the one end of the lever 62. The roller 65 is mounted on the other end of the oscillating lever 62, and is retained by the window opening 67a of the shutter 67. The shutter 67, which is retained by the shutter holder 69 provided on the frame 1, is vertically slidable. The shutter 67 is provided with a spring engaging pin 72 and is downwardly urged by a tension spring 74 provided between the spring engaging pin 72 and a spring engaging pin 73 mounted on the cover 70 secured to the shutter holder 69. Also, a hole 67b of such a shape as shown in the drawing is drilled in the shutter 67 to allow the tie rod 56 to extend therethrough. A nut 75 is secured in a given position to the tie rod 56. The solenoid 59 when energized moves in the direction of an arrow B to rotate the oscillating lever 62 in the counterclockwise direction, thereby raising the shutter 67 upwardly in the direction of an arrow C through the roller 65. Under this condition, a nut 75 is engaged with and stopped by the narrow portion 67c of the drilled hole 67b in the shutter 67 to stop the movement of the tie rod 56 in the direction of an arrow D. On the contrary, when by the solenoid 59, the shutter 67 is downwardly restored by the tension spring 74 to allow the nut 75 of the tie rod 56 to extend again through the drilled hole 67b of the shutter 67, thus allowing the tie rod 56 to move in the arrow direction through the full stroke.

Now, referring back to FIG. 6 and FIG. 7, the chain sprocket 37 drives a chain 76 to rotate a shaft 78 which carries a chain sprocket 77 engaging with the chain 76. A plurality of detecting cams 79 are mounted on the shaft 78 for the operation timing to detect the timing by a photoelectric detecting switch 80.

Figure 9:
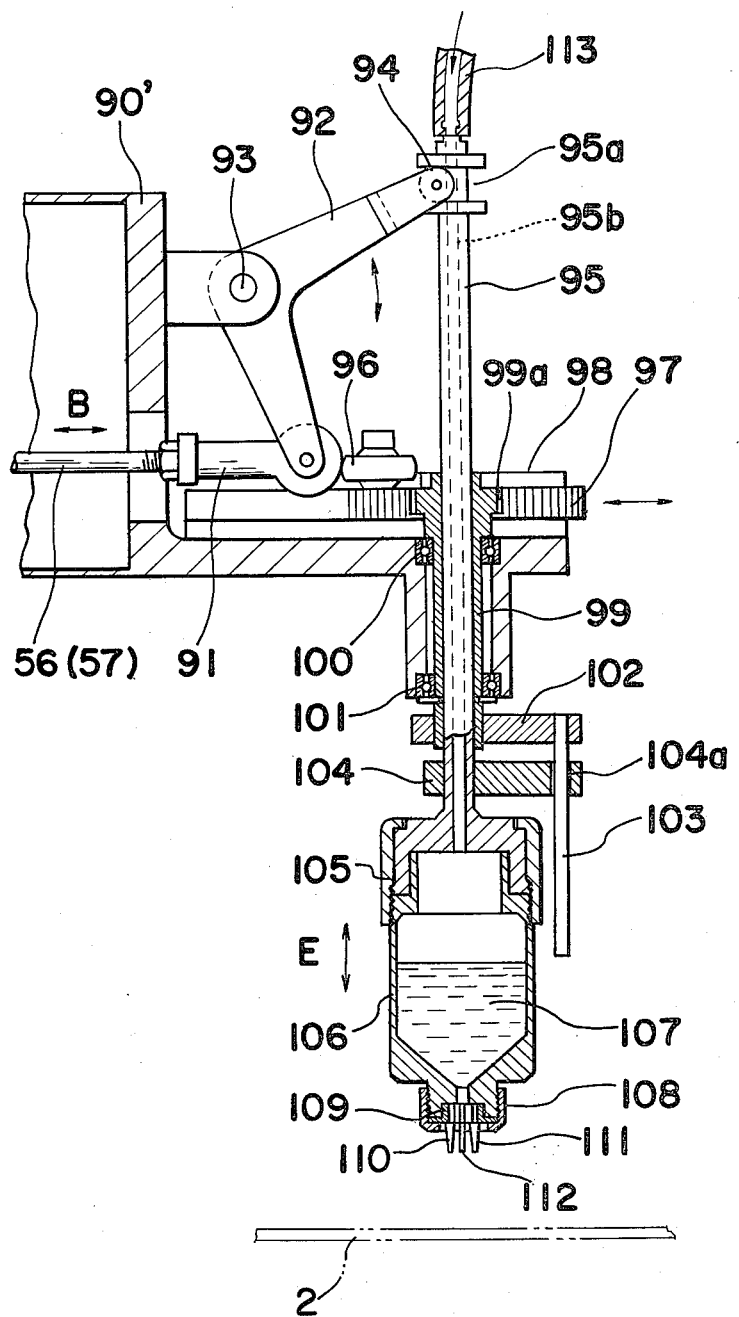
FIG. 9 is a fragmentary side sectional view of a bonding material applying unit employed in the arrangement of FIG. 4.
Figure 10:
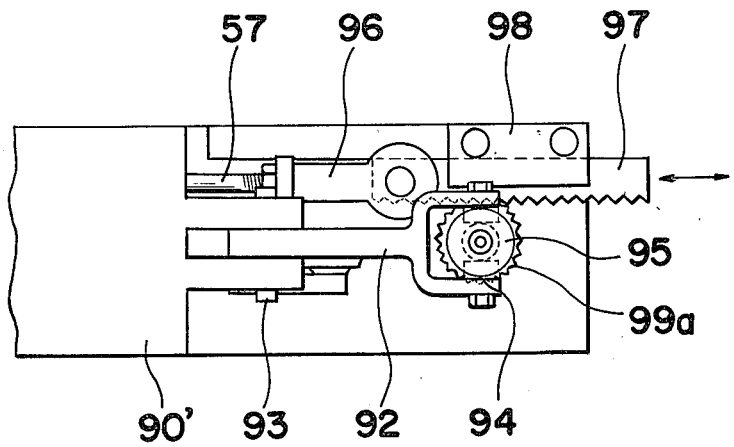
FIG. 10 is a top plan view of the bonding material applying unit of FIG. 9.

The bonding material applying apparatus 90 will be described hereinafter with reference to FIG. 9 and FIG. 10. The end of the tie rod 56 is coupled by a coupling 91 to the one end of a vertical motion lever 92 of which the intermediate portion is pivotally mounted on a case 90' of the apparatus, so that the vertical motion lever 92 is rotatable at a support point 93 by the linear motion of the tie rod 56. The vertical motion lever 92 is engaged with the groove 95a of a rod 95 by the roller 94 provided at the other end of the lever 92 to vertically operate the rod 95. The other tie rod 57 is coupled to a rack 97, which is slidably retained by a guide 98, by a coupling 96 to move the rack 97. The rack 97 is engaged with the gear 99a of a rotary boss 99, which retains the rod 95 for vertical sliding operation, thereby to rotate the rotry boss 99 together with the rod 95, the rotary boss 99 being supported by bearings 100 and 101 provided in the case 91'. A guide rod 103 is inserted under pressure into a lever 102 secured to the rotary boss 99 and passes at its lower end through a sliding hole 104a of a sliding lever 104 secured to the rod 95, thereby to slide the guide rod 103 along the sliding lever 104.

The function of the guide rod 103 is to transmit the rotation of the rotary boss 99 to the rod 95 irrespective of the sliding position of the rod 95. A bonding material vessel 106 is mounted, by a coupling nut 105, on the lower end of the rod 95. For example, an epoxide bonding material 107 of a thermo-setting type is filled into the vessel before the operation of the apparatus 90. A boss 109 is mounted on the lower end of the bonding material vessel 106 by a coupling nut 108, the boss having a bonding agent discharge nozzle 112 and stop pins 110, 111 secured thereto for positioning the nozzle 112 over the substrate 2. Also, the rod 95 has a through-hole 95b therein and is connected, at its top end, to a tube 113 of a pipe arrangement to be connected to a compressed air source. The operation will be described hereinafter. The tie rod 56 operates in the direction of an arrow D of FIG. 9 to rotate the vertical motion lever 92 for the vertical sliding motion of the rod 95. Also, the other tie rod 57 operates in the direction of an arrow D to rotate the rod 95 by a given angle through the rack 97 and the rotary boss 99. Compressed air is delivered through the tube 113 to pass through a through-hole 95b of the rod 95 thereby pressing the bonding material 107 located inside the bonding material vessel 106, so that the bonding material 107 is discharged through the nozzle 112 with a fine through-port therein.

Figure 11A:
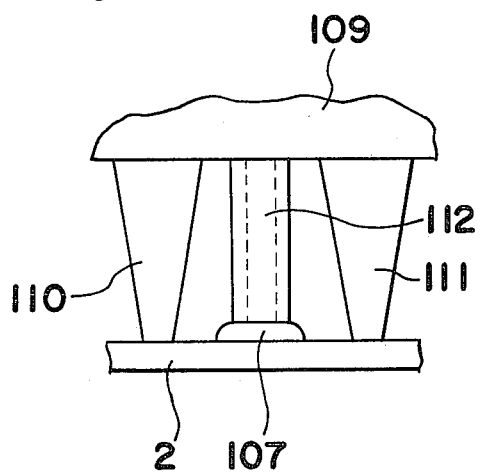
FIG. 11(a) is a partial enlarged view of a portion of FIG. 9.
Figure 11B:
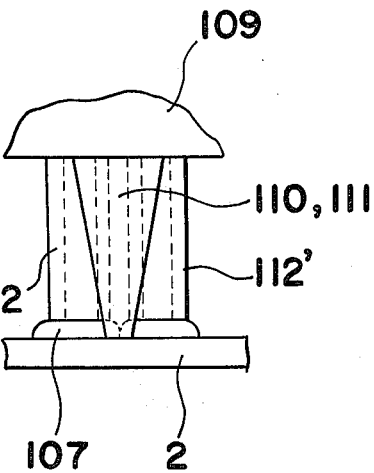
FIG. 11(b) is a partial side elevational view of the portion of FIG. 11(a)
Figure 11C:
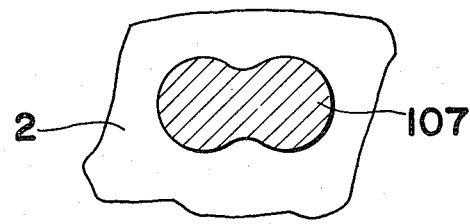
FIG. 11(c) is a top plan view explanatory of the state of application of the bonding agent.

The principle of the bonding material discharge and the bonding material application to the substrate 2 will be described with reference to FIG. 11. Referring to FIGS. 11(a) and 11(b), a clearance is provided between the nozzles 112, 112' and the substrate 2 with stop pins 110 and 111 of the box 109 being in contact against the substrate 2. Then, the bonding agent 107 discharged from the nozzles 112 and 112' are applied on the substrate 2. Thereafter, the nozzles 112 and 112' rise up over the substrate 2 to complete the bonding material applying operation. A plurality of nozzles such as a pair of nozzles 112 and 112' reduce the bonding material discharge amount per one nozzle to reduce the length of the remaining bonding material. Also, the bonding material applying shape from the nozzles 112 and 112' is approximately shown in FIG. 11(c) on the substrate 2.

The chip component engaging apparatus 120 will be described hereinafter with reference to FIGS. 12 to 14. Referring to FIG. 12, the end of the tie rod 56 is coupled to the one end of a vertical motion lever 122 by a coupling 121. The vertical motion lever 122 is rotatably supported at its intermediate portion by a support point 123. The vertical motion lever 122 is provided at its other end with a roller 123' which is engaged with the groove 124a of a rod 124 to vertically move the rod 124 by the rotation of the lever 122. The rod 124 is slidably retained in the vertical direction by a rotary boss 125 which is rotatably supported by bearings 126 and 127 mounted on a frame 120'. Also, the rotary boss 125 has a rotatable gear 128 engaged thereinto. A disengagement preventing holder 129 for the gear 128 is secured to the rod 124, which is rotatable together with the rotary boss 125.

Figure 13:
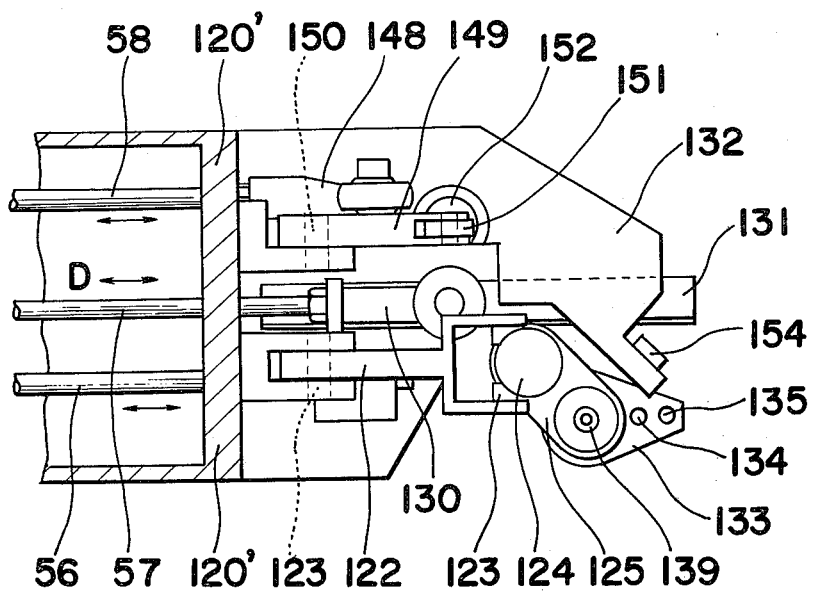
FIG. 13 is a top plan view of the unit of FIG. 12.
Figure 14:
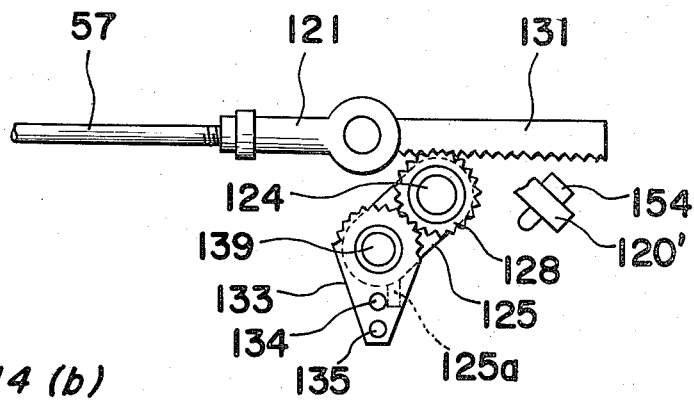
Figure 14:
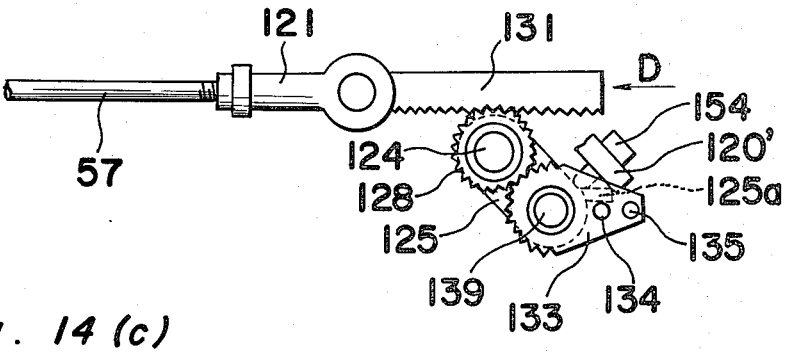
Figure 14:
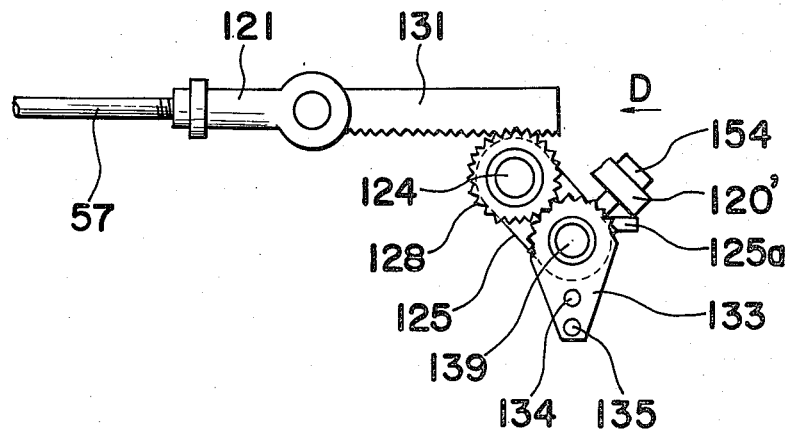

The distal end of the other tie rod 57 is coupled to a rack 131 by a coupling 130 as shown with FIG. 13. The rack 131 is slidably guided by a rack guide 132 provided on a case 120' of the apparatus, and is engaged with the gear 128, which is engaged with a sectional gear 133a of another rotary lever 133 having a stop pin 134 and a guide pin 135 fixedly inserted under pressure thereinto.

The rotary lever 133 is provided between and rotatably guided at its one end by the disengagement preventing holder 129 and at its other end by the rotary boss 125, and has a torsion coil spring 136 wound therearound and provided between the rotary lever 133 and the disengagement preventing holder 129. The rotary lever 133 is urged in its rotating direction with one end of the torsion coil spring 136 being connected to the disengagement preventing holder 129 and the other end thereof being connected to the rotary lever 133. Therefore, the stop pin 134 comes into contact against the projection 125a of the rotary boss 125 by the rotary urging force of the rotary lever 133 and is prevented from being rotated. FIG. 14(b) shows a condition where the stop pin 134 is in contact against the projection 125a of the rotary boss 125.

Referring back again to FIG. 12, a pair of arms 137 and 138 are secured to the upper and lower ends of the rod 124 and are adapted to guide so a pickup rod 139 for the chip components which slidably passes through holes provided in the arms 137 and 138. Also, the rod 139 is slidably guided by the rotary lever 133, the rod 139 passing through a hole provided in the lever 133. A guide lever 140 is mounted on the rod 139 and is slidably engaged with the guide pin 135 passing through a hole provided in the lever 40. The rod 139 is held upon the arm 138 by a retaining ring 141 provided at its coupling portion to stop its downward movement and is downwardly urged by the compression spring 142 provided between the rod 139 and arm 138. A chip component vacuum chuck 144 is slidably mounted within a coupling nut 143 provided on the lower end of the rod 139 and is urged by a compression spring 145 at the lower end of the nut 143. The rod 139 and the chuck 144 have through holes 139a and 144a therein, respectively, and a tube 147 is mounted on the top end of the rod 139. The tube 147 is connected to a vacuum generating apparatus so that the chip components 146 may be sucked up at the lower end of the chuck 144 by the vacuum introduced through through-holes 139a, 144a drilled in the rod 139 and the chuck 144 and the tube 147.

On the other hand, referring to FIG. 12 and FIG. 13, the end of another tie rod 58 is coupled to the one end of a lever 149 by a coupling 148. The lever 149 is rotatably supported at its intermediate portion by a support pin 150. A rotor 151 is provided on the other end of the lever 149 and is engaged with the guide groove 152a of a push rod 152. The push rod 152 is slidably supported and passed through a hole in a support boss 120' provided on the frame 120. A hammer 153 is secured to the lower end of the push rod 152 under the frame 120.

The operation of the tip component engaging apparatus 120 will be described hereinafter.

Referring to FIG. 12, the arrow-direction operation D of the tie rod 56 rotates the vertical motion lever 122 to vertically move the rod 124. The vertical motion of the rod 124 as it is transmitted to the rod 139 by the spring 142 under the guidance of the arms 137 and 138 until the chip component 146 sucked by the chuck 144 of the rod 139 is attached to the substrate 3. During the engagement of the chip component 146 by the chuck 144 and the engagement of the chip components 146 with the substrate 3, the pushing pressure of the chuck 144 is retained at approximately a constant value by the compression spring 145 of the nut 143 and the compression spring 142 of the rod 139.

Referring to FIG. 13, the arrow-direction reciprocating operation D of the tie rod 57 causes the reciprocating operation of the rack 131 to rotate the gear 128 engaging with the gear 133a of the rod 139. The rotating operation of the rod 139 will be described in more detail with reference to FIG. 14, (a), (b) and (c). FIG. 14(a) shows a condition where the rod 139 is disposed together with the chuck 144 on the feed side of the chip component. FIG. 14(b) shows a condition where the rod 139 is disposed on the engagement side of the substrate. Also, FIG. 14(c) shows a condition where the adsorption rod 139 is disposed on the engagement side of the substrate and has been rotated by 90°. In the operation from FIG. 14(a) to FIG. 14(b), the rack 131 is moved in the direction of an arrow D by a given small pitch to rotate the gear 128. At this time, since the rotating-direction urging force of the rotary lever 133 by the torsion coil spring 136 is stronger than the turning effort of the gear 128, the rotation of the gear 128 does not allow the rotary lever 133 to rotate until the projection 125a of the lever 125 comes into contact with a stop pin 154 provided on the frame 120' and the rotation of the gear 128 becomes the condition of FIG. 14(b) where the rotations of the rotary boss 125 and the rotary lever 133 start by the rotation of the gear 128. In the operation FIG. 14(b) to FIG. 14(c), the rack 131 is further moved, by a large given pitch, in the direction of an arrow D to further rotate the gear 128. At this time, the revolution of the rotary lever 125 is kept stopped by the stop pin 154 secured to the frame 120', and the rotation of the gear 128 is transmitted to the rotary lever 133 to rotate the rotary lever 133 together with the rod 139 by 90°. The condition of FIG. 14(b) and the condition of FIG. 14(c) are switch-controlled optionally at the base of the tie rod 57 to allow the 90° switching operation in the engaging direction of the chip component 146 during the engagement of the chip component 146 with the substrate in FIG. 12.

Also, in FIG. 13, the tie rod 58 operation in the direction of an arrow D causes the lever 149 rotation in the direction of an arrow F, which produces the vertical operation of the push rod 152. The vertical operation of the push rod 152 allows the hammer 153 to perform its downward depressing operation for the chip component 146, whereby the feed operation of the chip component feed unit to be described later is performed. A taping cassette 170 mounted on the table 160' of the chip component feed unit 160 shown in FIG. 4, and a straight advance feeder of a vibrating type will be described hereinafter in detail.

FIGS. 15 and 18 show one example of a condition where the chip components for use in the apparatus of the present invention are disposed in a line at given pitches on a form of a tape. Referring to FIGS. 15 and 16, a ribbon-like long material (hereinafter referred to as tape) 161 is made of a flexible strip plate and is provided, at equal pitches along the longitudinal direction, with receiving holes 161' for accommodating the chip components therein. Each of the receiving holes 161' has a chip component 163 accommodated therein. A pair of flexible sheets of film 162 and 162' for covering the receiving holes 161' are pasted, respectively, on the both faces of the corresponding tape 161 to prevent the chip components 163 from slipping out of the receiving holes 161'. One of covering sheets pasted on the top surface of the tape is adapted to be torn off easily from the tape by the tearing-off operation to take out the chip components from the receiving holes 161'.

Also, round perforations 164 for engaging the feeding pawl of the feeding machine are provided in line along the edge of the covering tape 162 corresponding, in location, to the pitches of the chip components 163.

Referring to FIG. 17 and FIG. 18, a tape 161 of another type is provided, at equal pitches, with concave recess 161, each accommodating a chip component 163 therein. A covering sheet 162 is pasted on the tape 161, for easy tearing-off, to prevent the chip components 163 from slipping out. Also, perforations 164 are provided in the accommodating tape 161, corresponding to the arranged pitches of the chip components 163 for the mechanical feeding operation.

As shown in FIG. 19, the chip components 165 disposed in a tape shape as shown in FIGS. 15 to 18 (hereinafter referred to as taping chip components) are wound around a reel 166 with one end extending to the outside, which is set in proper position of the table 160' of FIG. 4. A taping cassette 170 for delivering the tape of chip components 165 from the reel 166 will be described with reference to FIG. 20 to FIG. 23.

Referring to FIG. 20, the taping cassette 170 is composed of a body 171, a lever 172 adapted for intermittently delivering the tape of chip components 165 by a given pitch, a feed pawl 173 for one way operation of the lever, a ratchet wheel 174 to be engaged with the pawl, a take-up reel 175 for tearing off the covering sheet 162, a reel guide 176 for the reel 175, a rotary shaft 177 for imparting the winding-up rotating-force to the reel 175, a motor 178 for driving the rotary shaft 177, a belt 179, etc.

FIG. 21 shows the positional relationship between the taping cassette 170 and a vacuum chuck 144 for engaging the tip components 165. Referring to FIG. 21, the tape of chip components 165 are separated, by a pin 180, into the tape 161 with the tape components and the covering sheet 162 and the tape 161 is downwardly delivered through the intermittent rotation of the ratchet wheel 181, while the covering tape 162 is sequentially wound by a reel 175, which is rotated by the rotary shaft 177. When the intermittent delivery of the accommodating table 161 is in the inoperative position, the rotary shaft 177 and the reel 175 are in slipping operation with respect to each other. The vacuum chuck 144 is disposed in a given position near the ratchet wheel 181 over the substrate 3 to suck up the chip components 163 from the accommodating tape 161.

The intermittent delivery mechanism for the tape 161 in the taping cassette 170 will be described hereinafter with reference to FIGS. 22 and 23. Referring to the drawings, the lever 172 is rotatably engaged into the boss 181a of the ratchet wheel 181, and the ratchet wheel 174 is concentrically inserted securely under pressure into the ratchet wheel 181. The ratchet wheel 181 can rotate around a rotary shaft 183 through a bushing 182, the rotary shaft 183 being mounted on the body 171 by a hexagon nut 184. A feed pawl 173 is rotatably mounted on one end of the lever 172 with a support point pin 185 and is rotatable around the support point pin 185 under urging by a tension spring 186 to rotate in a clockwise direction. Also, a rotatable stop 188 which is rotably supported, by a support point pin 187, in a given location of the body 171 is urged by a compression spring 189 to come into pressure contact against a ratchet wheel 174 thereby preventing the ratchet wheel 174 from being rotated clockwise in FIG. 22. Referring to FIG. 23, a cover 190 is mounted on the body 171 to prevent the chip components 163 from out of the accommodating holes of the tape 161. The operation will be described with reference to FIG. 22. When the hammer 153 depresses the tip end of the lever 172 in the direction of an arrow E, the feed pawl 173 rotates together with the lever 172 to rotate the ratchet wheel 174, by a given pitch, in the direction of an arrow G. After the given pitch rotation of the wheel 174, the stop pawl 188 engages the ratchet wheel 174 to prevent the ratchet wheel 174 from effecting its reverse rotation. Once the urging pressure against the lever 172 by the hammer 153 is released, the lever 172 is restored to its original condition by the tension spring 186. At this time, the feed pawl 173 retreats, by one pitch, in the engagement with the ratchet wheel 174. Thus, the pressing operation of the lever 172 allows the ratchet wheel 174 to be intermittently rotatable in a direction by a given pitch. Namely, in FIG. 23, the rotating force from the ratchet wheel 174 to the ratchet wheel 181 is transmitted to intermittently deliver the tape 161 by a given pitch.

Also, the straight advance feeder 200 of a vibrating type including a chute 201 on the feed side and a chute 202 on the return side shown in FIG. 4 will be described with reference to FIG. 24.

Referring to FIG. 24, a chute 201 on the feed side has at its inner end a charging portion to be connected with a charging portion of a chute 202 on the return side to transfer the chip components from one side to the other side. Both of the chutes 201 and 202 are arranged in right, parallel relation to each other. The chute 202 on the return side can have a plurality of chip components 163 accommodated therein. A chute 201 on the feed side and the chute 202 on the return side are secured on their bottoms, respectively, to a base 206 by a pair of inclined leaf spring 204, 204' and leaf springs 205, 205'. Also, a vibrating plate 207 is secured to the bottom of the chute 201 on the feed side, while a vibrating plate 208 is secured to the bottom of the chute 202 on the return side. Also, a coil 210 is secured, through a fixed stand 209, to the base 206, and a given clearance is provided, respectively, between one end of the coil 210 and the vibrating plate 207, and between the other end of the coil 210 and the vibrating plate 208. Under this condition, a given current flows to the coil 210 to cause vibration of the chute 201 on the feed side and the chute 202 on the return side thereby to move the chip components 163 from the chute 202 on the return side to the chute 201 on the feed side through changing portions thereof in the direction of an arrow H. A metal fitting 203 is mounted on the chute on the feed side to ensure the stable supply of the chip components 163. Thin, light and compact vibration feeders of a loop type are disposed in a plurality of rows to feed various types of chip components.

Another embodiment of the tip component engaging apparatus will be described with reference to FIG. 25.

Referring to FIG. 25, a supporting point shaft 222 is provided on an engagement rod 221. A holder 224 which is tightened by a bolt 223 and can be secured to the supporting point shaft 222 is rotatable around the supporting point shaft 222. A vacuum chuck 225 is accommodated and slidably guided, in the direction of an arrow K, within the holder 224 and is urged by the compression spring 226 towards the outside of the holder 224. Also, a central flange 225a provided on the vacuum chuck 225 forms a piston, which is sealed by a seal ring 27 within the holder 224 to which a cover 228 is secured to close the outside of the holder 224. In a piping unit 228a, a tube 229 is connected to an external compressed air generating apparatus introduce compressed air within the holder 224 to operate the vacuum chuck 225 in the direction of the arrow K. A through-hole 225b is provided in the vacuum chuck 225 and has, at its one end, a tube 230 mounted thereto, the tube 230 being connected to the external vacuum generating apparatus to supply vacuum into the chuck 225.

The operation will be described hereinafter. The tape of chip components 165 has the covering sheet 162 torn off therefrom and components are intermittently delivered to a given pitch by a ratchet wheel in the same manner as mentioned in conjunction with FIG. 22. The vacuum chuck 225 is at its temporary projecting position upon application of the compressed air to the flange 225a as shown in the drawing. At this time, the chip component 163 in tape 161 intermittently fed is aligned, in position, with the tip end 225c of the vacuum chuck 225. Under this condition, the chip component 163 passes through the through-hole 225b of the vacuum chuck 225 and is drawn through vacuum so that the chip component 163 is drawn by the vacuum chuck 225.

When the compressed air fed through the tube 229 is released, the vacuum chuck 225 is separated from the tape 161 by the compression spring 226. Then, the holder 224 is rotated, through an external driving force of known type such as a motor, around the supporting point shaft 222 to rotate by 90° as shown in an arrow L. Under this condition, the compressed air is fed again through the tube 229 to lower the vacuum chuck 225 and the chip component 163 is carried to a given position on the substrate 3. Then, the vacuum suction from the tube 230 is released to complete the engagement of the chip component 163 with the substrate 3. As described hereinabove, the rotation of the holder 224, the switching operation of the compressed air from the tube 229, and the timing operation for the switching operation of the vacuum suction from the tube 230 are repeated to effect the cycle of operation indicated by arrow K.

With the above description of the embodiments in the drawings, it is clearly understood by those skilled in the art the arrangement of an electronic component engaging apparatus of the present invention comprising a bonding agent coating apparatus for feeding bonding agent to chip component engaging positions in a substrate, a chip component engaging unit disposed at a given interval from the bonding agent coating apparatus thereby placing electronic components on the bonding agent of the substrate, a chip component feed unit provided with plural rows of component feed apparatuses each being adapted to sequentially feed, in one line, the chip components to be engaged with the chip component engaging unit, a component feed unit driving unit for moving the plural component feed units to the chip component engaging unit to bring the chip component feed units, in a given order, to the component taking-out positions of the chip component engaging unit, and a substrate support unit for supporting the substrate at the same intervals as the given intervals between the bonding agent coating apparatus and the chip component engaging unit and having a means for varying the relative position with respect to the chip component engaging unit and the bonding agent coating apparatus, wherein the bonding agent coating for temporarily securing the chip components to the substrate and the engagement of the chip components with the bonding agent on said substrate are performed within the same apparatus, thus allowing the reasonable engagement of the electronic components. The advantages of the present apparatus are more effective mounting of the chip components on the circuit substrate as listed below.

(1) A special apparatus such as a screen printing press or the like is not required for the process prior to the engaging operation.

(2) The substrate can be easily prepared, since the substrate coated with a bonding material is handled only within the engaging apparatus.

(3) The bonding material coating and the electronic component engagement can be performed within the same apparatus.

(4) For supplying the components, a simple tape having the chip components arranged thereon may be employed. By merely preparing such tapes for the kinds required for the mounting onto the substrate, it is possible to mount necessary kinds of chip components at required positions on one substrate. When it is required to change the chip component engaging positions on the substrate, such alterations may be readily effected.

(5) The stable feed of the chip components can be made by the use of the tape of chip components.

Although the present invention has been fully described by way of example with reference to the accompanying drawings, it is to be noted that various changes and modifications are apparent to those skilled in the art. Therefore, unless otherwise such changes and modifications depart from the scope of the present invention, they should be construed as included therein.

What is claimed is:

1. A component engaging apparatus for mounting electronic components and the like onto a substrate which comprises: a bonding agent applying unit for supplying bonding agent to chip component mounting positions on a substrate; a chip component mounting section disposed at a predetermined interval from said bonding agent applying unit for placing electronic parts on the bonding agent applied on the substrate; a chip component feeding section provided with a plurality of rows of component feeding devices for sequentially feeding in a line, the chip components to be mounted at said chip component mounting section; a driving section for driving said chip component feeding section which causes the plurality of the component feeding devices to relatively move with respect to said chip component mounting section for bringing said chip component feeding section into a component withdrawal position of said chip component mounting section in a predetermined order; and a substrate support section which supports the substrate at the same interval as said predetermined interval between said bonding agent applying unit and said chip component mounting section, said substrate support section being further provided with means for altering the relative position thereof with respect to said chip component mounting section and bonding agent applying unit.

2. A component engaging apparatus as claimed in claim 1, wherein said chip component mounting section further includes a vacuum chuck coupled to an air suction device and means for moving said vacuum chuck.

3. A component engaging apparatus comprising a bonding agent coating apparatus for feeding bonding agent to chip component engaging positions on a substrate, a chip component engaging unit disposed at a given interval from said bonding agent coating apparatus for placing electronic components on the bonding agent on the substrate, a chip component feed unit provided with plural rows of component feed apparatuses each being adapted to sequentially feed, in one line, the chip components to be engaged in said chip component engaging unit, a component feed unit driving unit for moving said plural component feed units to said chip component engaging unit to bring said chip component feed units, in a given order, to the component taking-out positions of the chip component engaging unit, and a substrate support unit for supporting said substrate at the same intervals as the given intervals between said bonding agent coating apparatus and said chip component engaging unit and having a means for varying the relative position with respect to said chip component engaging unit and said bonding agent coating apparatus.

4. A component engaging apparatus in accordance with claim 3, wherein the chip component engaging unit has a vacuum chuck connected to an air inlet apparatus and a moving means for the vacuum chuck.

* * * * *